US007608862B2

(12) United States Patent
Sakuma et al.

(10) Patent No.: US 7,608,862 B2
(45) Date of Patent: Oct. 27, 2009

(54) LIGHT EMITTING DEVICE AND A LIGHTING APPARATUS

(75) Inventors: Ken Sakuma, Sakura (JP); Koji Omichi, Sakura (JP); Naoto Hirosaki, Tsukuba (JP)

(73) Assignees: Fujikura Ltd., Tokyo (JP); National Institute for Materials Science, Ibaraki (JP)

( * ) Notice: Subject to any disclaimer, the term of this patent is extended or adjusted under 35 U.S.C. 154(b) by 0 days.

(21) Appl. No.: 11/067,741

(22) Filed: Mar. 1, 2005

(65) Prior Publication Data

US 2005/0194604 A1 Sep. 8, 2005

(30) Foreign Application Priority Data

| Mar. 2, 2004 | (JP) | ............................ P2004-058092 |
| Mar. 2, 2004 | (JP) | ............................ P2004-058184 |
| Feb. 25, 2005 | (JP) | ............................ P2005-052068 |

(51) Int. Cl.
*H01L 27/15* (2006.01)
*H01L 29/24* (2006.01)

(52) U.S. Cl. ............................. 257/98; 257/81; 257/91; 257/94; 257/99; 257/96; 257/79; 257/100; 257/80; 257/90

(58) Field of Classification Search .................... 257/81, 257/98, 100, E33.061, 91, 94, 99, 96, 79, 257/80, 90; 252/301.36, 509; 313/498–500
See application file for complete search history.

(56) References Cited

U.S. PATENT DOCUMENTS

| 6,255,670 | B1 * | 7/2001 | Srivastava et al. ............. 257/89 |
| 6,294,800 | B1 * | 9/2001 | Duggal et al. .................. 257/89 |
| 6,592,780 | B2 * | 7/2003 | Hohn et al. ............ 252/301.36 |
| 6,632,379 | B2 | 10/2003 | Mitomo et al. |
| 6,861,658 | B2 * | 3/2005 | Fiset ........................ 250/504 R |
| 2003/0030038 | A1 | 2/2003 | Mitomo et al. |
| 2003/0168643 | A1 | 9/2003 | Mitomo et al. |
| 2004/0056256 | A1 * | 3/2004 | Bokor et al. .................. 257/79 |
| 2004/0135504 | A1 * | 7/2004 | Tamaki et al. ............... 313/512 |

(Continued)

FOREIGN PATENT DOCUMENTS

JP 2927279 B2 5/1999

(Continued)

OTHER PUBLICATIONS

T. Mukai et al., "White and UV LEDs", Oyo Buturi, vol. 68, No. 2, pp. 152-155, 1999.

(Continued)

*Primary Examiner*—Kenneth A Parker
*Assistant Examiner*—Joseph Nguyen
(74) *Attorney, Agent, or Firm*—Sughrue Mion, PLLC

(57) ABSTRACT

A light emitting device comprises at least two lead wires, a light emitting element that is disposed on an end portion of at least one of said lead wires and connected electrically with the end portion and the other lead wire, and a phosphor that absorbs at least part of the light emitted from said light emitting element and emanates light having different wavelengths from the wavelength of the light emitted from said light emitting element, wherein the excitation spectrum of said phosphor has a flat region in a wavelength range including a primary wavelength of the light from said light emitting element.

8 Claims, 15 Drawing Sheets

U.S. PATENT DOCUMENTS

2005/0001225 A1 * 1/2005 Yoshimura et al. ............ 257/98

FOREIGN PATENT DOCUMENTS

| JP | 2000-512806 A | 9/2000 |
| JP | 2001-144332 A | 5/2001 |
| JP | 2002-158376 A | 5/2002 |
| JP | 2002-363554 A | 12/2002 |
| JP | 2003-124527 A | 4/2003 |
| JP | 2003-206481 A | 7/2003 |

OTHER PUBLICATIONS

Rong-Jun Xie, et al., "Optical Properties of Eu2+ in α-SiAlON," J. Phys. CHem. B., 108, pp. 12027-12031 (2004).

"Phosphor Handbook", edited under the Auspices of Phosphor Research Society, CRC Press, front cover, preface, and pp. 315-358 (1998).

Rong-Jun Xie, et al., Preparation and Luminescence Spectra of Calcium-and Rare-Earth (R=Eu, Tb and Pr)- Codoped α-SiAlON Ceramics', Journal of the American Ceramic Society, US, 2002, vol. 85, No. 5, p. 1229-1234.

* cited by examiner

FIG. 7

| SAMPLE | DESIGNED COMPOSITION | | MIXTURE COMPOSITION (UNIT: PERCENT BY MASS) | | | |
|---|---|---|---|---|---|---|
| | x(Ca) | y(Eu) | $\alpha$-$Si_3N_4$ | AlN | $CaCO_3$ | $Eu_2O_3$ |
| #31 | 0.875 | 0.04 | 67.23 | 17.98 | 13.69 | 1.10 |
| #32 | 0.875 | 0.0833 | 65.14 | 19.03 | 13.56 | 2.27 |
| #33 | 0.875 | 0.25 | 57.49 | 22.91 | 13.05 | 6.55 |
| #34 | 0.875 | 0.5 | 47.02 | 28.20 | 12.36 | 12.42 |
| #35 | 0.75 | 0.04 | 71.11 | 15.83 | 11.94 | 1.12 |
| #36 | 0.75 | 0.0833 | 68.96 | 16.92 | 11.81 | 2.30 |
| #37 | 0.75 | 0.25 | 61.04 | 20.94 | 11.36 | 6.66 |
| #38 | 0.75 | 0.5 | 50.23 | 26.42 | 10.75 | 12.60 |
| #39 | 1 | 0.04 | 63.46 | 20.05 | 15.41 | 1.08 |
| #40 | 1 | 0.0833 | 61.44 | 21.08 | 15.25 | 2.23 |
| #41 | 1 | 0.25 | 54.04 | 24.82 | 14.69 | 6.45 |
| #42 | 1 | 0.5 | 43.90 | 29.93 | 13.92 | 12.24 |
| #43 | 1.25 | 0.04 | 56.27 | 24.02 | 18.66 | 1.05 |
| #44 | 1.25 | 0.0833 | 54.38 | 24.97 | 18.48 | 2.17 |
| #45 | 1.25 | 0.25 | 47.46 | 28.46 | 17.81 | 6.27 |
| #46 | 1.25 | 0.5 | 37.93 | 33.26 | 16.92 | 11.89 |
| #47 | 0.5 | 0.04 | 79.31 | 11.32 | 8.22 | 1.16 |
| #48 | 0.5 | 0.0833 | 76.98 | 12.50 | 8.14 | 2.38 |
| #49 | 0.5 | 0.25 | 68.49 | 16.81 | 7.82 | 6.88 |
| #50 | 0.5 | 0.5 | 56.94 | 22.69 | 7.39 | 12.98 |
| #51 | 0.25 | 0.04 | 88.06 | 6.49 | 4.26 | 1.20 |
| #52 | 0.25 | 0.0833 | 85.58 | 7.75 | 4.20 | 2.46 |
| #53 | 0.25 | 0.25 | 76.46 | 12.41 | 4.03 | 7.10 |
| #54 | 0.25 | 0.5 | 64.08 | 18.72 | 3.81 | 13.39 |

FIG. 8

| SAMPLE | EMISSION MONITOR WAVELENGTH | EXCITATION PEAK WAVELENGTH | 3% FLAT REGION | | BREADTH |
|---|---|---|---|---|---|
| #31 | 581nm | 449nm | 416nm | ~ 453nm | 37nm |
| #32 | 585nm | 449nm | 427nm | ~ 455nm | 28nm |
| #33 | 593nm | 450nm | 441nm | ~ 469nm | 28nm |
| #34 | 591nm | 457nm | 445nm | ~ 469nm | 24nm |
| #35 | 581nm | 449nm | 426nm | ~ 453nm | 27nm |
| #36 | 585nm | 449nm | 432nm | ~ 456nm | 24nm |
| #37 | 592nm | 449nm | 436nm | ~ 458nm | 22nm |
| #38 | 591nm | 449nm | 442nm | ~ 463nm | 21nm |
| #39 | 581nm | 449nm | 418nm | ~ 454nm | 36nm |
| #40 | 586nm | 449nm | 434nm | ~ 456nm | 22nm |
| #41 | 594nm | 449nm | 442nm | ~ 469nm | 27nm |
| #42 | 592nm | 462nm | 447nm | ~ 470nm | 23nm |
| #43 | 582nm | 449nm | 435nm | ~ 456nm | 21nm |
| #44 | 585nm | 449nm | 439nm | ~ 458nm | 19nm |
| #45 | 595nm | 467nm | 448nm | ~ 473nm | 25nm |
| #46 | 595nm | 466nm | 447nm | ~ 474nm | 27nm |
| #47 | 574nm | 428nm | 404nm | ~ 449nm | 45nm |
| #48 | 581nm | 449nm | 413nm | ~ 453nm | 40nm |
| #49 | 589nm | 449nm | 408nm | ~ 455nm | 47nm |
| #50 | 588nm | 449nm | 439nm | ~ 458nm | 19nm |
| #51 | 574nm | 426nm | 406nm | ~ 446nm | 40nm |
| #52 | 580nm | 436nm | 405nm | ~ 451nm | 46nm |
| #53 | 586nm | 413nm | 389nm | ~ 452nm | 63nm |
| #54 | 591nm | 449nm | 431nm | ~ 454nm | 23nm |

FIG. 9

| | | Ca | | | | | |
|---|---|---|---|---|---|---|---|
| | | 0.250 | 0.500 | 0.750 | 0.875 | 1.000 | 1.250 |
| Eu | 0.040 | 40nm | 45nm | 27nm | 37nm | 36nm | 21nm |
| | 0.083 | 46nm | 40nm | 24nm | 28nm | 22nm | 19nm |
| | 0.250 | 63nm | 47nm | 22nm | 28nm | 27nm | 25nm |
| | 0.500 | 23nm | 19nm | 21nm | 24nm | 23nm | 27nm |

LIGHT EMITTING DEVICE AND A LIGHTING APPARATUS

CROSS REFERENCE TO RELATED APPLICATION

This application claims the benefit of priority under 35 U.S.C. § 119 to Japanese Patent Applications No. 2004-058092 and No. 2004-058184, filed on Mar. 2, 2004, and No. 2005-52068, filed on Feb. 25, 2005, the entire contents of which are incorporated by reference herein.

BACKGROUND OF THE INVENTION

1. Field of the Invention

The present invention relates to a light emitting device typically for use in illumination and a lighting apparatus using the same.

2. Description of the Related Art

There has since been a white light emitting diode which uses a blue light emitting diode element that emits short wavelength light such as blue light and a phosphor that is excited by absorbing part or all of the light from the blue light emitting diode element and in turn emanates longer wavelength light such as yellow light.

Examples of such white light emitting diodes include one having a compound semiconductor blue light emitting diode element and a cerium-activated yttrium-aluminum-garnet phosphor, the material absorbing the blue light and emanating yellow fluorescence, which is a complementary color of blue. (Refer to Japanese Patent Publication No. 2927279, for example.)

In recent years, a great improvement has been made on the intensity of the light emitted from the above-stated white light emitting diodes, leading to a general use of such LEDs as a light source of a lighting apparatus.

In addition, there have been commercially available many white light emitting lighting apparatuses having a dimmer controller with which a user can control the brightness of the apparatus.

SUMMARY OF THE INVENTION

However, the above white light emitting diodes have the following drawback yet to be solved.

When white light emitting diodes are used for illumination, a plurality of the diodes are installed therein for the purpose of providing a sufficient quantity of light. Also in some cases, a plurality of lighting apparatuses are disposed for the same purpose. In these circumstances, there has been a drawback of variations in chromaticity among the plurality of the white light emitting diodes, the variations being caused at the time of fabrication.

Furthermore, since human eyes are very sensitive to only a minute difference in chromaticity of illumination, a reduction in the element-to-element chromaticity variations among the light emitting diode elements is an important factor in terms of a quality improvement of the lighting apparatuses and thereby a reduction in the chromaticity variations among the white light emitting diodes is a very significant issue to be addressed.

Chromaticity variations of such a lighting apparatus can be caused, for example, from variations in the center wavelength of the light from the blue light emitting diode element, the wavelength variations taking place during fabrication of the element per se, and also in the amount of phosphors applied in a packaging process.

Particularly, a shift in the wavelength of the light from the blue light emitting diode element also has a great influence on fluorescence properties of yellow-light-emanating phosphors.

FIG. 1 shows an excitation spectrum from a cerium-activated yttrium-aluminum-garnet phosphor, which has been generally used. This spectrum was observed using a spectrofluorometer at the monitoring wavelength of 563 nm, which is the emission peak wavelength of the phosphor.

As shown in FIG. 1, the excitation peak wavelength is 468 nm and an excitation wavelength area in which a reduction in fluorescence intensity is 3 percent or less (a "three percent flat" region) is from 465 nm to 473 nm (a breadth of 8 nm). In other words, the excitation spectrum has a spectral shape having almost no flat region and the excitation intensity decreases with a shift from the peak wavelength.

In the white light emitting diodes having such optical properties, a wavelength shift in the light emitted from the blue light emitting diode element causes a decrease in yellow fluorescence intensity accordingly. Therefore, the chromaticity of the white light obtained from a color mixture of blue and yellow comes to shift toward blue.

FIG. 2 shows emission spectra from a phosphor belonging to the yttrium aluminum garnet system, each spectrum having been measured with an excitation wavelength of 458 nm, 463 nm, 468 nm, 473 nm, and 478 nm, respectively. From FIG. 2, it is understood that the fluorescence intensity decreases with the wavelength shift of the excitation light from the excitation peak wavelength and only a several nanometer shift leads to a significant intensity reduction.

By the way, there is a drawback in that a change in electric current supplied to a blue light emitting diode element causes a shift in the center wavelength therefrom.

For example, Takashi Mukai and Shuji Nakamura have reported in "White and Ultra-violet LED" (OYO BUTURI, Vol. 68, No. 2, pp. 0152-0155 (1999)) that the peak wavelength of the light from a GaN blue LED shifts from 473 nm to 470 nm when a forward bias current changes from 0.1 mA to several tens mA.

Because of such a drawback, a white light emitting diode based on the blue light emitting diode element has a disadvantage in that the chromaticity of the light therefrom changes depending on the current supplied thereto. Therefore, a lighting apparatus employing the white light emitting diode will also present such a drawback of a chromaticity change in regulating the brightness.

Depending on applications of the lighting apparatus, a dimmer function, and not to mention an on/off function, is provided to the lighting apparatus in order to regulate the brightness of the apparatus. The dimmer function can be realized by equipping the lighting apparatus with a variable constant-current source that sets an electric current to be supplied to the white light emitting diode based on a signal from a certain type of controller. While the signal for controlling a quantity of light from the apparatus may be supplied to the variable constant-current source generally with a manual knob, other means such as data communication can provide the current source with the signal from outside. Whatever the case may be, a change in electric current supplied to the white light emitting diode causes a change in not only brightness but also chromaticity.

In order to investigate such a chromaticity change, the inventors of the present invention have carried out the following experiments.

First of all, for a comparison purpose, a blue light emitting diode was fabricated only with a blue light emitting diode element, without adding any phosphor.

Then, the blue light emitting diode was assembled into a blue light lighting apparatus having a dimmer function by connecting a variable constant-current source to the blue light emitting diode and then a controller having a manually operable knob or the like to the variable constant-current source.

Next, a change in chromaticity of the light from the above blue lighting apparatus was investigated by changing an electric current thereto with a manipulation of the knob. As a result, it was found that when the current changes from 1 mA to 20 mA, the chromaticity coordinates (x, y) in the CIE XYZ color specification system shift from (0.143, 0.025) to (0.144, 0.019), which corresponds to a distance shift of only 0.006 on the chromaticity diagram.

This shift means that the emission wavelength from the lighting apparatus has shifted to shorter wavelengths, which is often referred to as a blue shift.

Secondly, a white light emitting diode was fabricated with a blue light emitting diode element and the above-mentioned phosphor in the yttrium aluminum garnet system.

Then, the white light emitting diode was assembled into a white light lighting apparatus having a dimmer function by connecting a variable constant-current source to the light emitting diode and then a controller having a manually operable knob or the like to the variable constant-current source.

Next, a change in chromaticity of the light from the lighting apparatus was investigated by changing an electric current thereto with a manipulation of the knob. As a result, it was found that when the current changes from 1 mA to 20 mA, the chromaticity coordinates (x, y) in the CIE XYZ color specification system shift from (0.298, 0.290) to (0.291, 0.274), which corresponds to a distance shift of as large as 0.017 on the chromaticity diagram.

These experimental results suggest that such a conventional lighting apparatus need to be further improved.

In consideration of such circumstances, the present invention therefore is directed to provide a light emitting device with reduced variations in chromaticity.

Also, the present invention is directed to offer a lighting apparatus capable of reducing both a chromaticity variation that takes place during fabrication and a chromaticity shift that takes place when regulating a light quantity.

A first aspect of the present invention provides a light emitting device comprising at least two lead wires, a light emitting element that is disposed on an end portion of at least one of the lead wires and connected electrically with the end portion and the other of the lead wires, and a phosphor that absorbs at least part of the light emitted from the light emitting element and emits fluorescence having a different wavelength from the wavelength of the light emitted from the light emitting element. The excitation spectrum of the phosphor has a flat region in a wavelength range including a principal wavelength of the light from the light emitting element.

A second aspect of the present invention provides a light emitting device according to the first aspect, wherein an excitation wavelength area in which a reduction in fluorescence intensity is three percent or less in the flat region has a breadth of about 20 nm or more.

A third aspect of the present invention provides a light emitting device according to the first aspect, wherein the light emitting element is a blue light emitting element, and wherein the phosphor absorbs light having a wavelength of from 440 nm to 470 nm and appearing purplish blue or blue, and thereby emits fluorescence having a wavelength of from 550 nm to 600 nm and appearing yellow green, greenish yellow, yellow, yellowish orange, or orange.

A fourth aspect of the present invention a light emitting device according to the first aspect, wherein the phosphor is a rare-earth-metal activated SiAlON ceramics phosphor.

A fifth aspect of the present invention provides a light emitting device according to the fourth aspect, wherein the SiAlON ceramics phosphor is a divalent-europium activated Ca-alpha-SiAlON ceramics phosphor.

A sixth aspect of the present invention provides a light emitting device according to the fifth aspect, the SiAlON ceramics phosphor is expressed in a general formula as $Ca_x(Si, Al)_{12}(O,N)_{16}Eu^{2+}_y$, wherein the Ca composition x is in a range of from 0 to 1.0 and the Eu composition y is in a range of from 0 to 0.25.

A seventh aspect of the present invention provides a light emitting device according to the sixth aspect, wherein an excitation wavelength area in which a reduction in fluorescence intensity is three percent or less in the flat region has a breadth of about 40 nm or more, and wherein the SiAlON ceramics phosphor has the Ca composition x of from 0 to 0.5.

An eighth aspect of the present invention provides a light emitting device according to the first aspect, wherein the light emitting element is a light emitting diode element.

A ninth aspect of the present invention provides a lighting apparatus comprising at least two lead wires, a light emitting element that is disposed on an end portion of at least one of the lead wires and connected electrically with the end portion and the other of the lead wires, a phosphor that absorbs at least part of the light emitted from the light emitting element and emits fluorescence having a different wavelength from the wavelength of the light emitted from the light emitting element, the excitation spectrum of the phosphor having a flat region in a wavelength range including a principal wavelength of the light from the light emitting element, a variable constant current electric power supply for supplying electric current to the lead wires, and an electric current controller for setting an electric current value in the variable constant current electric power supply.

A tenth aspect of the present invention provides a lighting apparatus according to the ninth aspect, wherein an excitation wavelength area in which a reduction in fluorescence intensity is three percent or less in the flat region has a breadth of about 20 nm or more.

An eleventh aspect of the present invention provides a lighting apparatus according to the ninth aspect, wherein the light emitting element is a blue light emitting element, and wherein the phosphor absorbs light having a wavelength of from 440 nm to 470 nm and appearing purplish blue or blue, and thereby emits fluorescence having a wavelength of from 550 nm to 600 nm and appearing yellow green, greenish yellow, yellow, yellowish orange, or orange.

A twelfth aspect of the present invention provides a lighting apparatus according to the ninth aspect, wherein the phosphor is a rare-earth-metal activated SiAlON ceramics phosphor.

A thirteenth aspect of the present invention provides a lighting apparatus according to the twelfth aspect, wherein the SiAlON ceramics phosphor is a divalent-europium activated Ca-alpha-SiAlON ceramics phosphor.

A fourteenth aspect of the present invention provides a lighting apparatus according to the thirteenth aspect, the SiAlON ceramics phosphor is expressed in a general formula as $Ca_x(Si, Al)_{12}(O,N)_{16}Eu^{2+}_y$, wherein the Ca composition x is in a range of from 0 to 1.0 and the Eu composition y is in a range of from 0 to 0.25.

A fifteenth aspect of the present invention provides a lighting apparatus according to the fourteenth aspect, wherein an excitation wavelength area in which a reduction in fluorescence intensity is three percent or less in the flat region has a breadth of about 40 nm or more, and wherein the SiAlON ceramics phosphor has the Ca composition x of from 0 to 0.5.

A sixteenth aspect of the present invention provides a lighting apparatus according to the ninth aspect, wherein the light emitting element is a light emitting diode element.

By the way, the above-stated colors are based on the reference FIG. 1 of the Japanese Industrial Standard (JIS) Z 8110. Purplish blue and blue correspond to the chromaticity area of AOMURASAKI and AO, respectively, in FIG. 1 of JIS Z 8110. Yellow green or greenish yellow, yellow, and yellowish orange or orange fall within the area of KIMIDORI, KI and KIAKA, respectively, in FIG. 1 of JIS Z 8110.

According to the present invention, since the excitation spectrum of the phosphor has a flat region in a wavelength range including a principal wavelength of the light from the light emitting element, a reduction in chromaticity variation due to variations in the wavelength of the light from the light emitting element is realized. Therefore, the present invention can provide a light emitting device that has a superior chromaticity uniformity and can be fabricated with an enhanced production yield.

In addition, according to the present invention, there can be realized a reduction not only in the chromaticity variation related to fabrication of the light emitting element but also in the chromaticity shift due to a wavelength shift of the light from the element. Therefore, the lighting apparatus employing the above-mentioned light emitting device can prevent chromaticity changes from taking place when regulating a quantity of light by changing an electric current to the light emitting device.

As apparent from the above arguments, the present invention can provide a lighting apparatus with a reduced fabrication-related chromaticity variation and a reduced chromaticity shift when regulating a quantity of light.

BRIEF DESCRIPTION OF THE DRAWINGS

In the accompanying drawings:

FIG. 7 is a table listing a composition of each divalent-europium activated Ca-alpha-SiAlON ceramics phosphor sample.

FIG. 8 is a table listing an excitation wavelength area in which a reduction in fluorescence intensity is 3 percent or less.

FIG. 9 is a summary table listing an excitation wavelength area in which a reduction in fluorescence intensity is 3 percent or less in relation with the composition of a divalent-europium activated Ca-alpha-SiAlON ceramics phosphor.

DESCRIPTION OF THE PREFERRED EMBODIMENTS

Referring to accompanying drawings, a light emitting device and a lighting apparatus according to the present invention will be described in detail.

While a light emitting diode having a light emitting diode chip will be described as an example of the light emitting device according to the present invention in the following embodiments, the following embodiments are intended for purposes of illustration only and are not intended to limit the scope of the invention. Therefore, whereas those skilled in the art can devise various types of working embodiments including each and all elements, all the embodiments fall within the scope of the present invention.

In addition, in all the drawings used as an aid in describing the following embodiments, identical reference numbers will be used to designate identical or corresponding elements, thereby eliminating undue repetition of description about identical elements.

A First Embodiment

Figure 1:
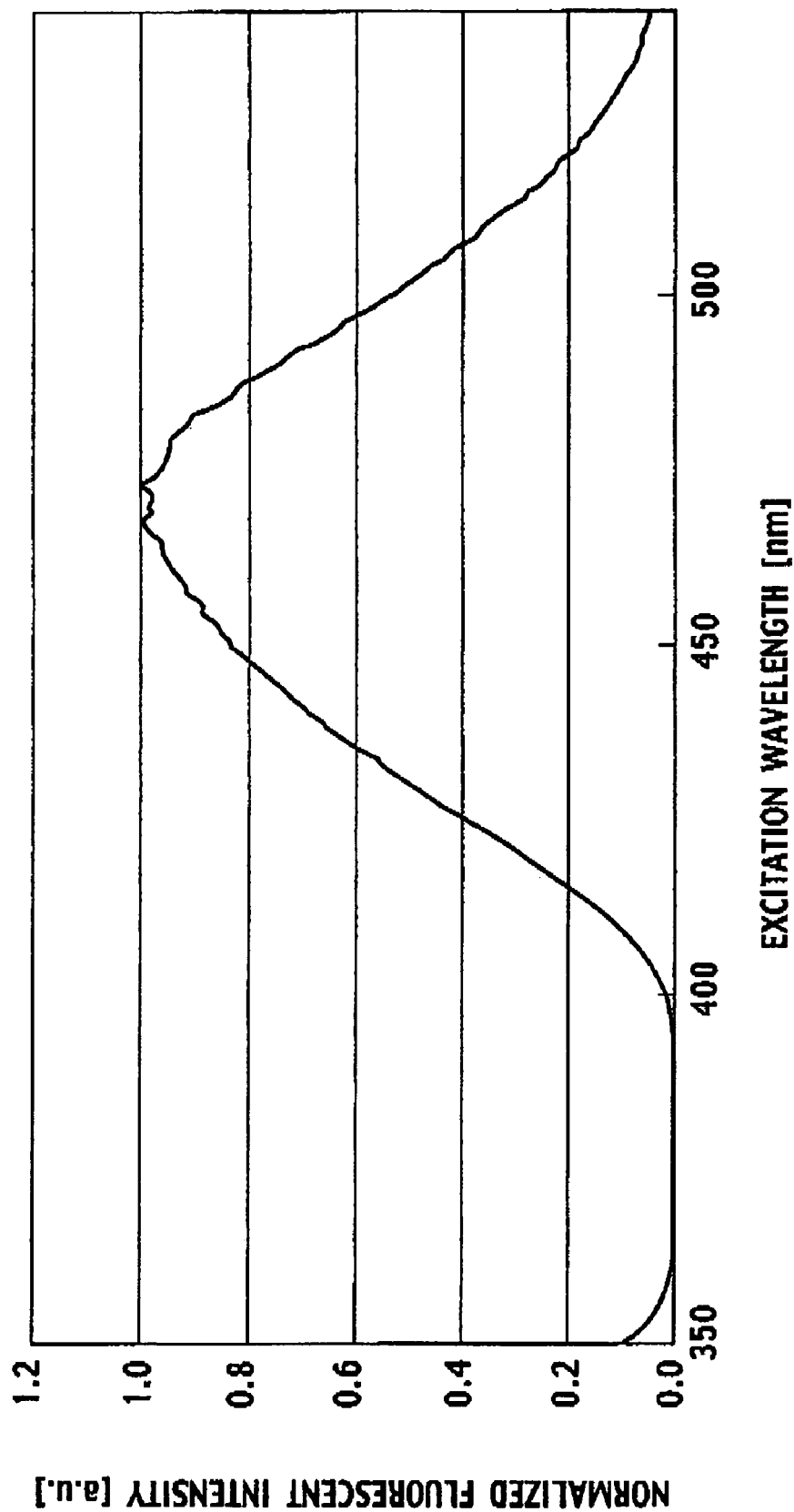
FIG. 1 illustrates an excitation spectrum of a related art phosphor.
Figure 2:
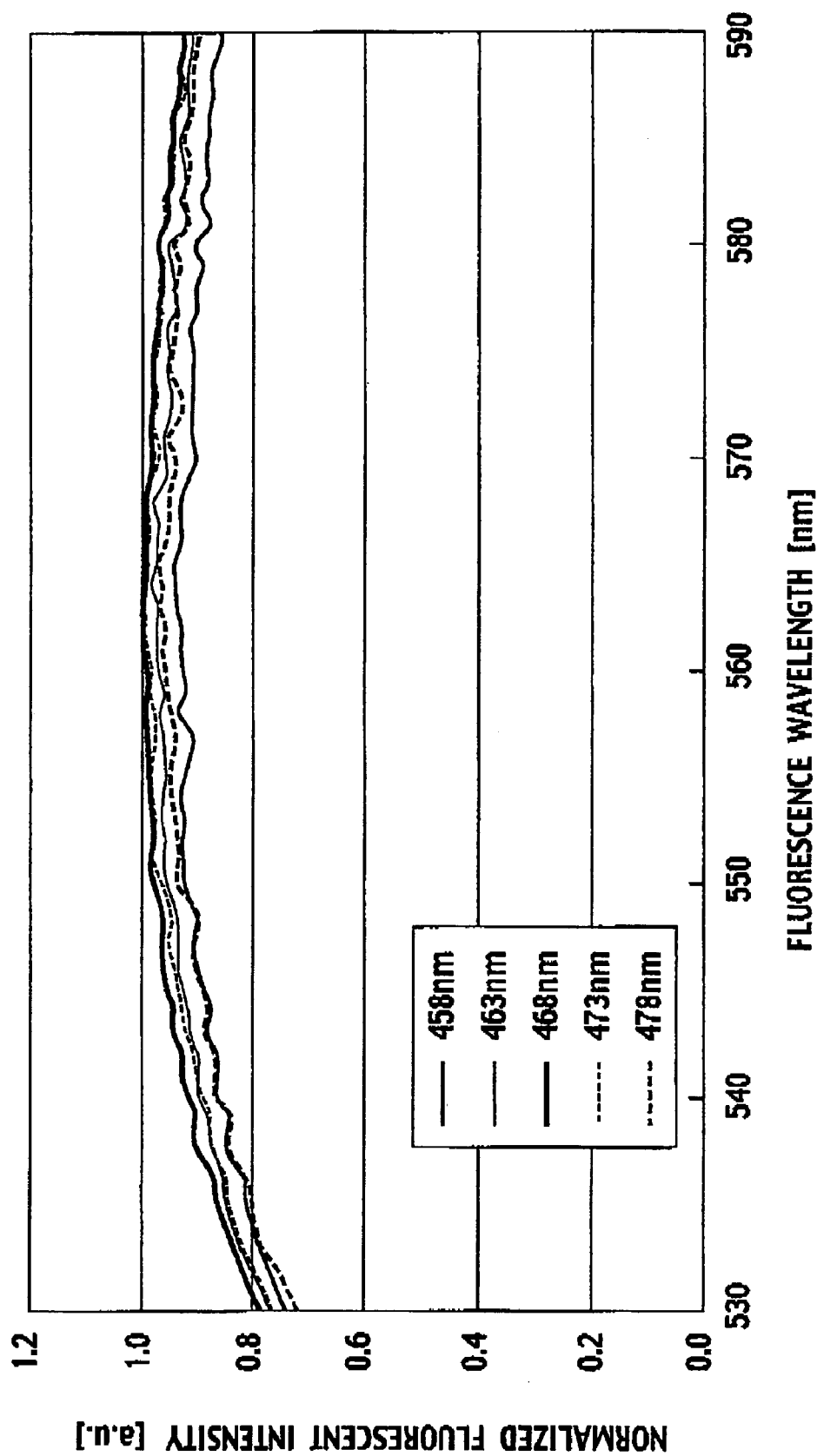
FIG. 2 illustrates emission spectra, each of which was measured with excitation lights having various wavelengths.
Figure 3:
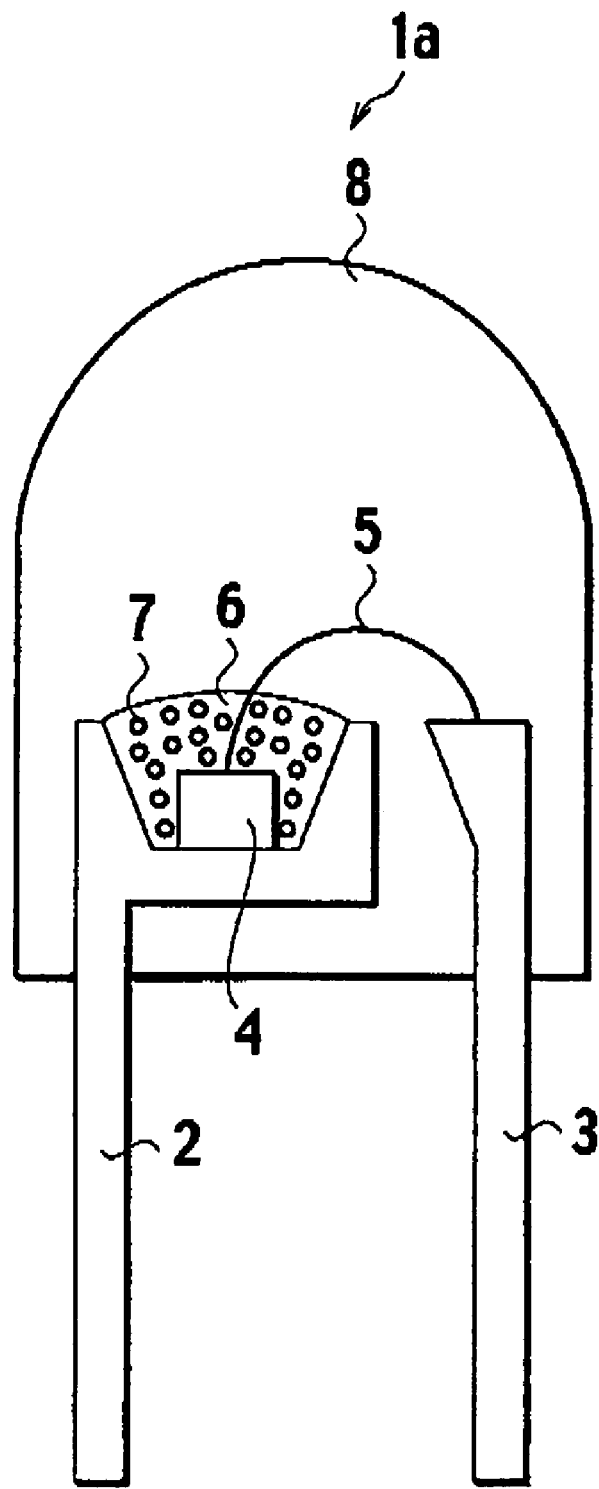
FIG. 3 is a cross-sectional view of a light emitting diode according to a first embodiment of the present invention.
Figure 4:
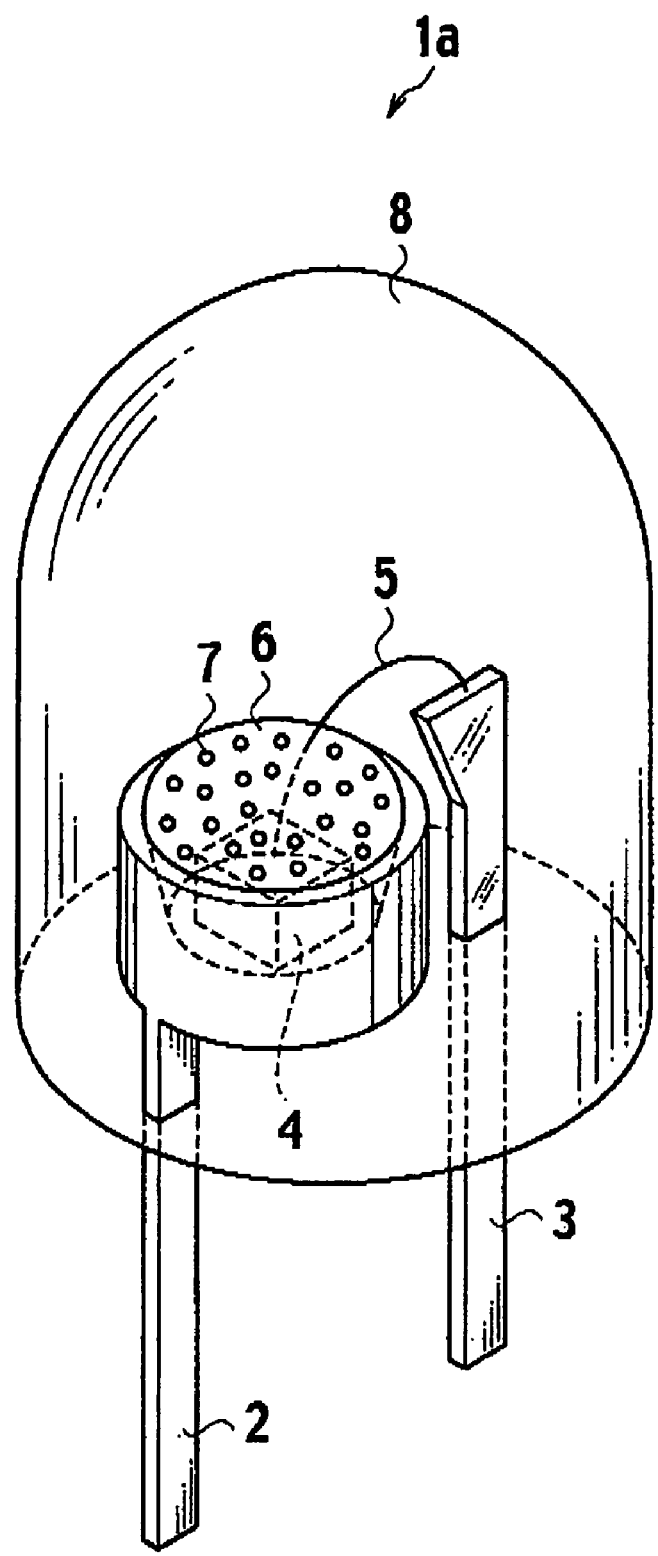
FIG. 4 is a perspective view of the light emitting diode shown in FIG. 3.

FIG. 3 is a cross-sectional view of a light emitting diode 1a according to a first embodiment of the present invention. FIG. 4 is a perspective view of the light emitting diode 1a.

The light emitting diode 1a is formed into a tubular shape with a round end at its top, in other words, a shape resembling an artillery shell. The light emitting diode 1a includes lead wires 2, 3, a light emitting diode chip (blue light emitting diode chip) 4, a bonding wire 5, a phosphor 7, a first resin 6, and a second resin 8. The lower portion of the lead wires 2, 3 is exposed out of the second resin 8.

At the upper end of the lead wire 2, there is provided a cup in which a light emitting diode chip 4 (light emitting element) is placed. The light emitting diode chip 4 is electrically connected with the lead wire 2 by die bonding or the like using electrically conductive paste. The light emitting diode chip 4 is also electrically connected with the lead wire 3 by wire bonding or the like using the bonding wire 5.

In addition, the vicinities of the light emitting diode chip 4, including the recess of the above-stated cup, are sealed with the first resin 6 into which the phosphor 7 is dispersed.

Furthermore, the lead wires 2, 3, the light emitting diode chip 4, the bonding wire 5, and the resin 6 are sealed with the second resin 8.

Then, the phosphor 7 (FIGS. 3 and 4) in the present invention will be explained.

In a light emitting diode according to the present invention, as the phosphor 7 is used a phosphor of which an excitation spectrum has a flat region in a wavelength range including a principal wavelength of the light from the light emitting chip 4. In the first embodiment, since the light emitting diode chip 4 is a blue light emitting diode chip, a phosphor emanating yellow light upon excitation by blue light, specifically, a rare-earth-metal activated Ca-alpha-SiAlON, more specifically, a divalent-europium activated Ca-alpha-SiAlON is used as the phosphor 7 (Refer to Japanese Patent Application Laid-open Publication 2002-363554 for the phosphor). When this phosphor is used as the phosphor 7, an amount of the phosphor dispersed into the first resin 6 can preferably be about 35 weight percent. The SiAlON phosphor will be hereinafter described in detail.

Figure 5:
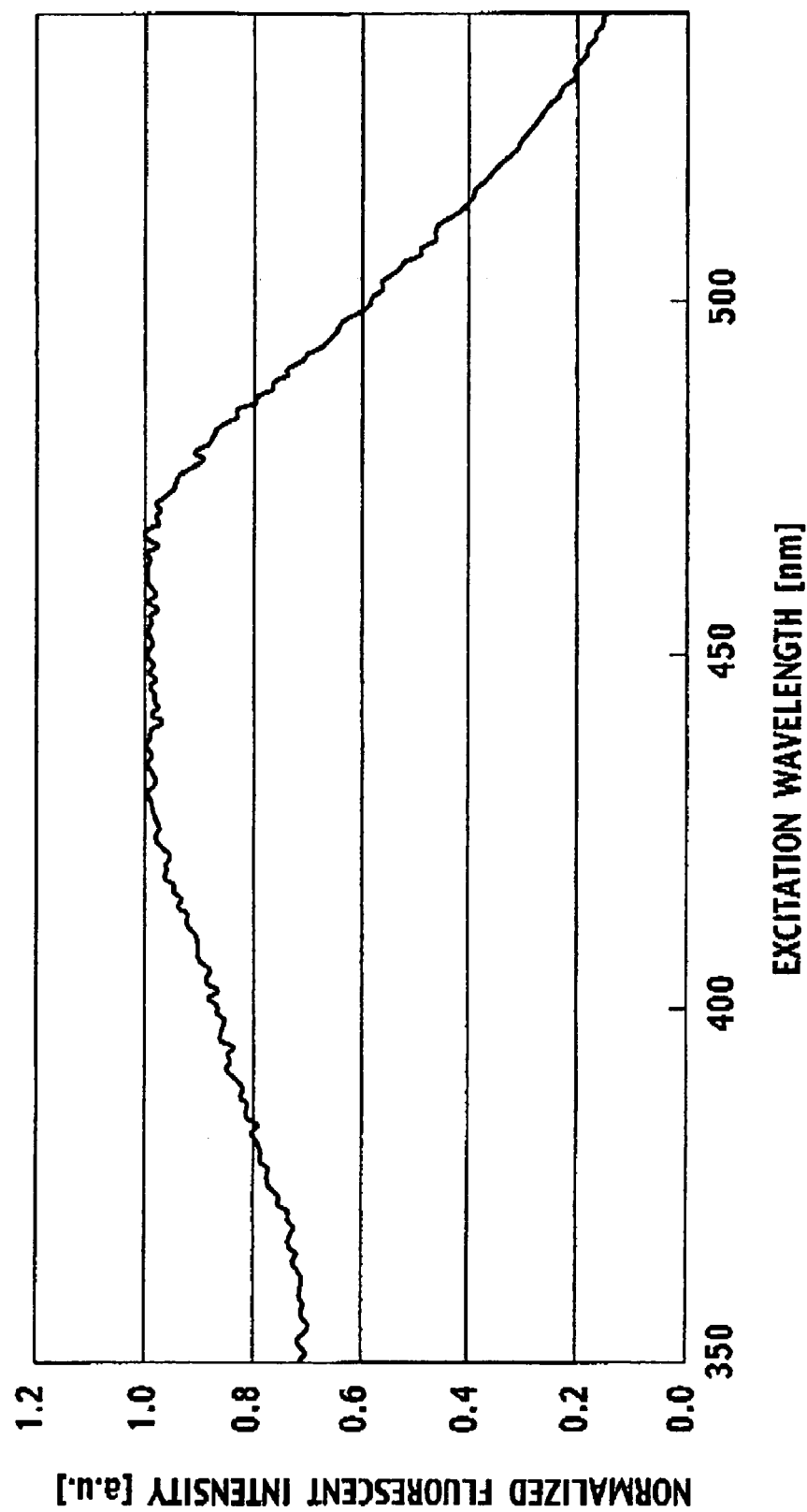
FIG. 5 illustrates an excitation spectrum of a phosphor according to the present invention.

FIG. 5 shows an excitation spectrum from the above-stated SiAlON phosphor. This spectrum has been measured using a spectrofluorometer at the monitoring wavelength of 590 nm, which is the emission peak wavelength of this phosphor.

As shown in FIG. 5, the excitation spectrum of the SiAlON phosphor has the peak wavelength of 461 nm and an excitation wavelength area in which a reduction in fluorescence intensity is 3 percent or less (three percent flat region) extends widely from 423 nm to 471 nm (a breadth of 48 nm).

Since the excitation spectrum has a wide flat region, a reduction in fluorescent intensity due to a shift in the wavelength of the excitation light is effectively prevented.

Figure 6:
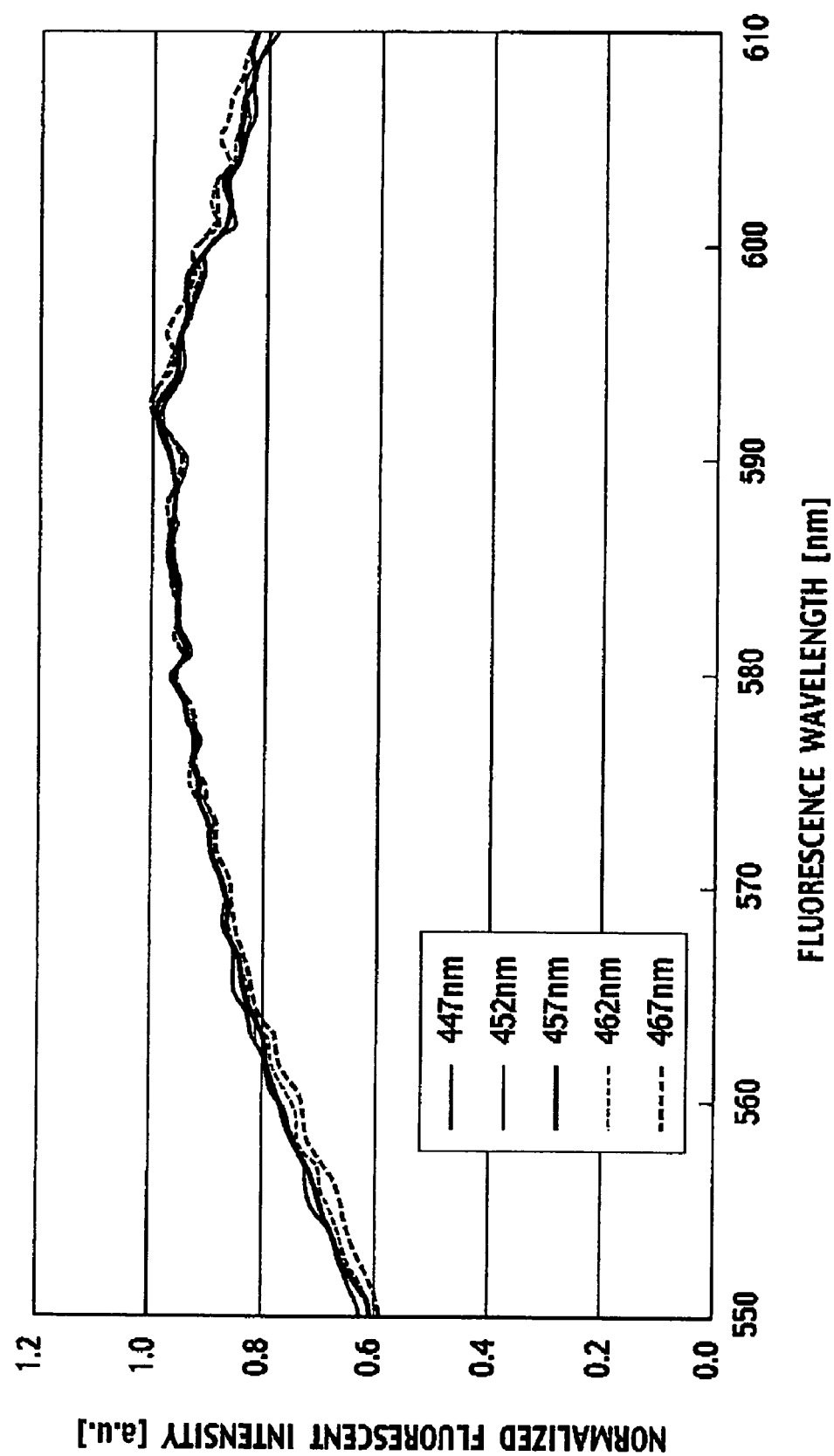
FIG. 6 illustrates emission spectra, each of which was measured with excitation lights having various wavelengths.
Figure 10:
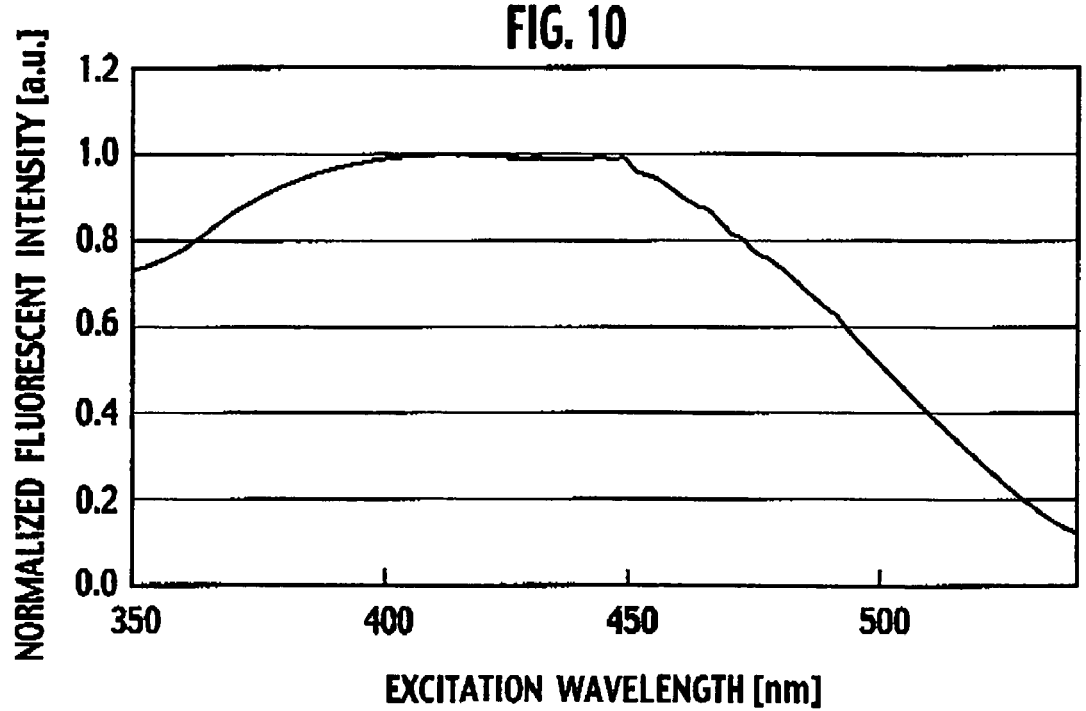
FIG. 10 illustrates an example of an excitation spectrum of a phosphor according to the present invention.
Figure 11:
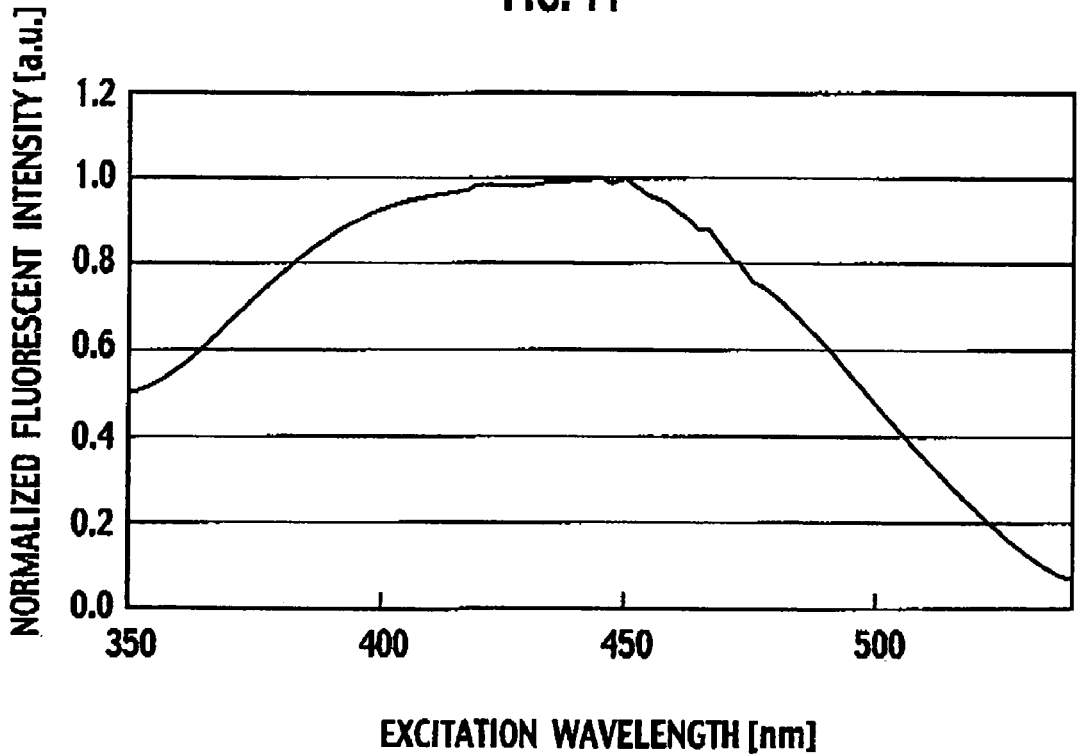
FIG. 11 illustrates another example of an excitation spectrum of a phosphor according to the present invention.
Figure 12:
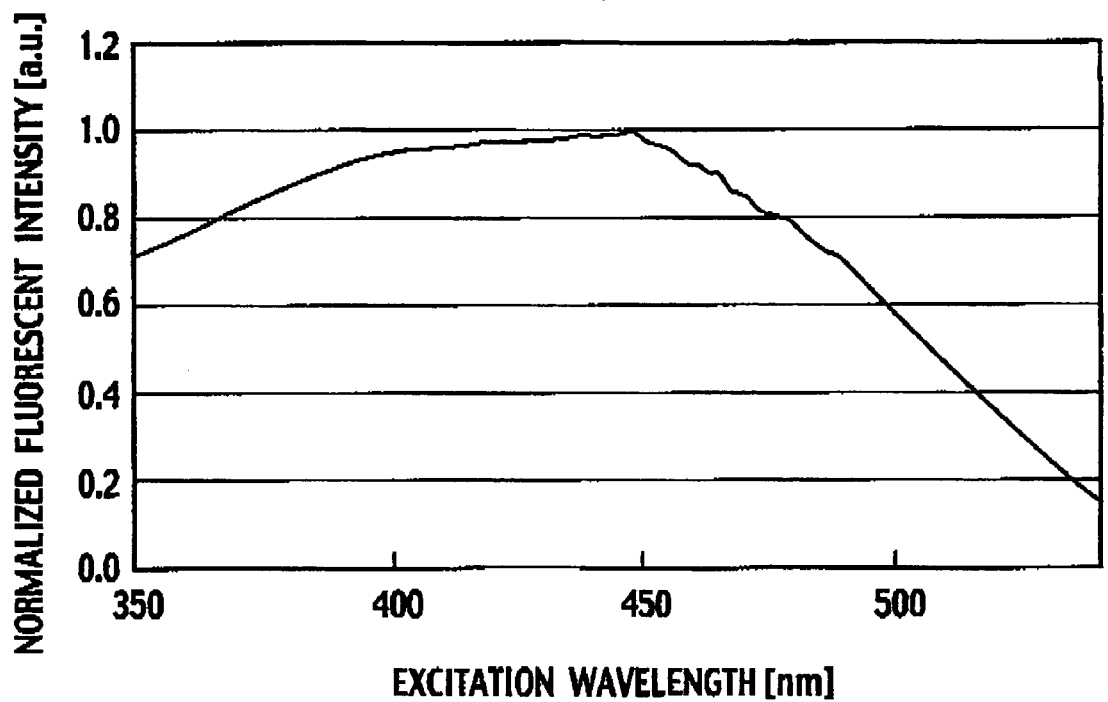
FIG. 12 illustrates yet another example of an excitation spectrum of a phosphor according to the present invention.
Figure 13:
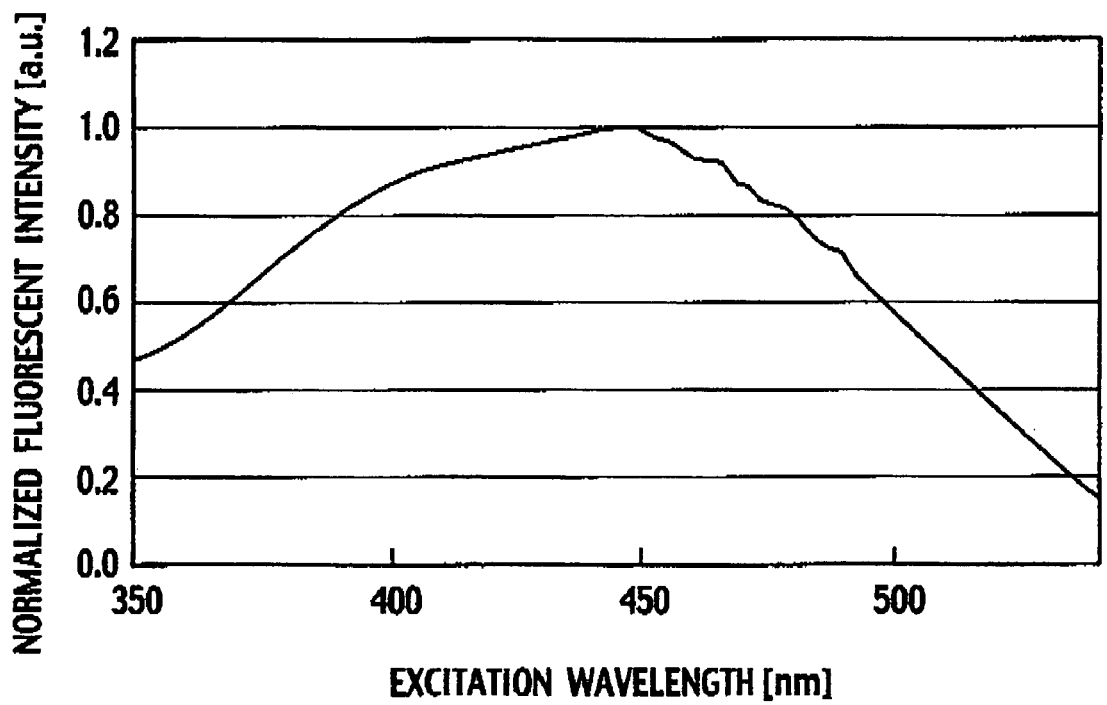
FIG. 13 illustrates still another example of an excitation spectrum of a phosphor according to the present invention.
Figure 14:
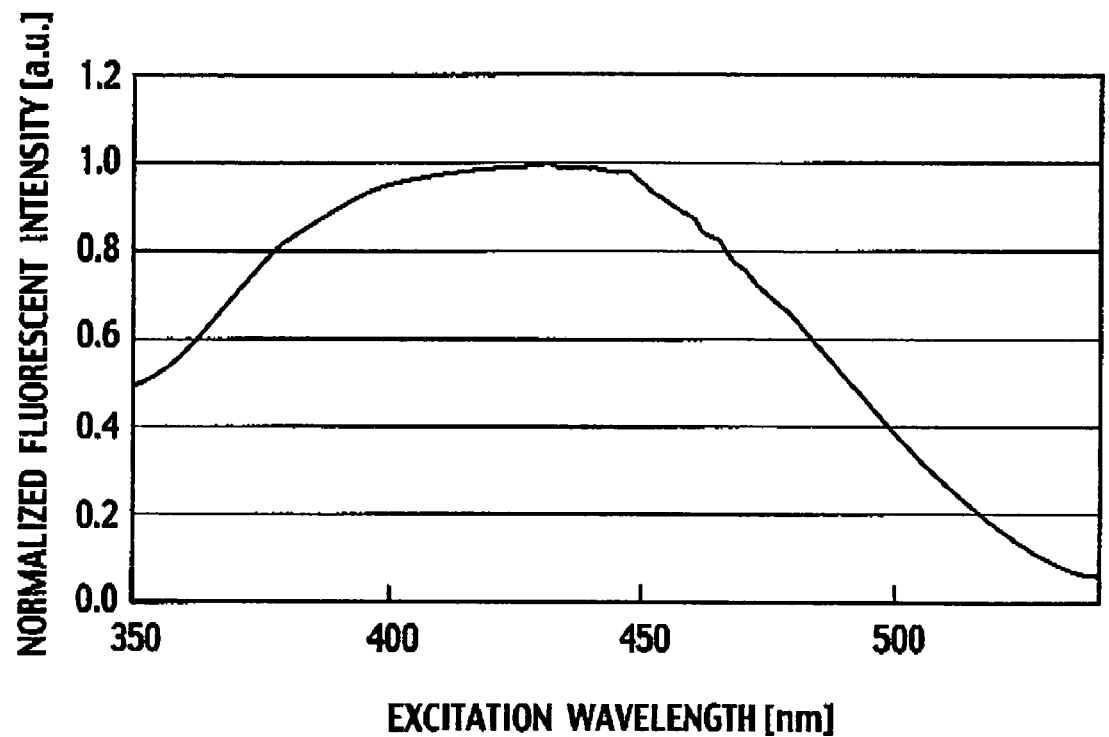
FIG. 14 illustrates yet still another example of an excitation spectrum of a phosphor according to the present invention.

FIG. 6 illustrates emission spectra from the phosphor, each spectrum having been measured with an excitation wavelength of 447 nm, 452 nm, 457 nm, 462 nm, and 467 nm, respectively, as described with reference to FIG. 5.

As illustrated in FIG. 6, even when the excitation wavelength differs by as much as 20 nm, almost no difference is observed in the spectral shape and the fluorescence intensity.

From the above results, a shift in the wavelength of the light from the light emitting diode chip 4 causes almost no reduction in the fluorescence intensity of the yellow-light-emanating phosphor. As a result, there can be realized a white light emitting diode with an extremely low shift in the chromaticity of the white light obtained from the color mixture.

Also, even if the wavelength of the light from the light emitting diode chip 4 varies on an element-to-element basis, the variation in chromaticity of the white light emitting diode can be prevented, thereby improving the production yield and providing a high quality white light emitting device with low chromaticity variation.

Next, a required flat region in an excitation spectrum will be discussed.

Even though a wavelength shift in the light from the light emitting diode chip concerned is only several nanometers, the excitation spectrum should have a wider and sufficient flat region in order to realize a sufficient flatness in several nanometers, as apparently understood from a comparison between the spectra shown in FIGS. 1, 2 and FIGS. 5, 6.

For example, a three percent flat region of 20 mm, not necessarily 48 nm as stated above, results in a satisfactory emission spectral shape with a sufficiently flat region.

Then, a synthesis method employed in this embodiment is explained in detail.

A divalent europium activated Ca-alpha-SiAlON ceramics is expressed in the following general formula.

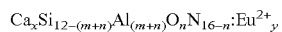

Here, in this embodiment, x=0.75, m=2.25, n=1.125, and y=0.25.

Firstly, as starting materials, chemical reagents such as alpha Silicon Nitride (alpha-$Si_3N_4$), Aluminum Nitride (AlN), Calcium Carbonate ($CaCO_3$), and Europium Oxide ($Eu_2O_3$) were weighed, mixed, and tentatively pelletized into a cylindrical shape. Secondly, the tentative pellet of mixture was pressed using a Cold Isostatic Pressing (CIP) machine.

Then, Gas Pressure Sintering (GPS) process was carried out to synthesize the SiAlON ceramic from the pellet for 2 hours at 2,000 degrees Celsius in a 1 MPa Nitrogen atmosphere using a GPS machine. Finally, the sintered pellet was crushed to powder and then classified using a sieve to obtain a powder phosphor having a grain diameter of 60 micrometers or less.

Next, the result of an experiment carried out to investigate a preferable composition range of the phosphor 7 (SiAlON phosphor) will be described. In this experiment, 24 samples of the phosphor having a respectively different composition as listed in FIG. 7 were synthesized and the optical properties thereof were evaluated. The synthesis method used in this experiment was different from one explained above.

As starting materials, the following chemical reagents such as alpha Silicon Nitride (alpha-$Si_3N_4$), Aluminum Nitride (AlN), Calcium Carbonate ($CaCO_3$), and Europium Oxide ($Eu_2O_3$) in a form of powder were prepared as is the case with the above-stated synthesis method. A weight ratio of the starting materials was calculated for each sample with an intention to obtain the designed composition listed in FIG. 7.

Then, the powder starting materials were weighted in accordance with the designed composition listed in FIG. 7. After this, a predetermined amount of n-hexane was added to the weighed materials and then the n-hexane-added materials were well mixed by a planetary ball mill for 2 hours.

The mixed materials were desiccated by a rotary evaporator and then pounded well in a mortar. Next, the pounded materials were granulated using a stainless steel test sieve having an aperture size of 125 micrometers to obtain powdered materials having a corresponding grain diameter, which were then charged into a covered container made of Boron Nitride. By the way, in this synthesis method. CIP was not carried out.

Next, the Gas Pressure Sintering (GPS) process was carried out for the powder materials in the covered container at a temperature of 1,700 degrees Celsius in a 1 MPa Nitrogen atmosphere for about 8 hours. The temperature and the pressure were much higher than those in the above-stated synthesis method. Since the powder materials were solidified into a mass due to the sintering, the mass was then crushed in order to obtain a powder phosphor sample. The mass after the sintering was easily crushed into powder with an application of only a little force.

After this, the excitation and emission spectra of the 24 powder phosphor samples were measured. The measurement was carried out by a fluorescence spectrophotometer using Rhodamine B and a standard light source to correct the spectral distribution.

From the measurement results on the emission spectrum for each sample, it has been found that all these samples have a sufficient emission intensity and appropriate excitation or emission wavelengths, and are therefore preferable for a white light emitting diode. Particularly, the samples having a composition x from 0.75 to 1.0 and y from 0.04 to 0.25 have been found to be superior to the others in terms of emission intensity.

An excitation wavelength area in which a reduction in emission intensity is 3 percent or less (three percent flat region), the flat region being obtained from the above measurement of the excitation spectrum for each sample, is summarized in FIGS. 8 and 9. By the way, the excitation spectrum was measured with a monitor wavelength that is the same as the emission peak wavelength. From FIGS. 8 and 9, every sample has a sufficient flat region in general. For example, even in the samples #44 and #50 having a relatively narrow excitation spectrum, the flat region is as wide as 19 nanometers. As apparent from FIGS. 8 and 9, the samples that have a wider flat region of 20 nanometers or more can be obtained in their composition x from 0 to 1.0 and y from 0 to 0.25. Furthermore, when the composition x is in a range from 0 to 0.5 and y is in a range from 0 to 0.25, the samples having a much wider flat region of 40 nanometers or more can be obtained.

FIGS. 10, 11, 12, 13 and 14 illustrate an excitation spectrum of samples #53, #48, #49, #36 and #52, respectively. From these figures, it has been found that every sample has a very wide and flat excitation breadth on contrary to the phosphor material (YAG:Ce) in the conventional art shown in FIG. 1.

By the way, although the SiAlON phosphor of which the excitation spectrum is illustrated in FIG. 5 has the same composition as the sample #37, the flat region is somewhat narrower in this experiment than that shown in FIG. 5 (refer to FIG. 8). However, the flat region of 20 nanometers or more is still obtained. The reduction in a breadth of the flat region is presumably caused from a difference in a synthesis method and/or synthesis conditions.

Next, a manufacturing procedure will be described about the light emitting diode 1a having the above-mentioned SiAlON phosphor shown in FIGS. 3 and 4.

In a first process, the light emitting diode chip 4 is die-bonded in the cup at the tip of the lead wire 2 with electrically conductive paste.

In a second process, the light emitting diode chip 4 is wire-bonded to the lead wire 3 with the bonding wire 5.

In a third process, the first resin 6 dispersed adequately with the SiAlON phosphor 7 is pre-deposited onto the element-accommodating cup to coat the light emitting diode chip 4 and then cured.

In a fourth process, the second resin 8 is deposited to enfold the lead wires 2, 3, the light emitting diode chip 4 and the first resin 6 and then cured. The fourth process is ordinarily carried out by casting.

In the meanwhile, the lead wires 2, 3 can be made as an integral member in which both of the wires are connected at their ends. When using lead wires of such a type, a fifth process has to be adopted after the fourth process, wherein the connecting portion between the lead wires is removed to separate the lead wires 2, 3 into an individual member.

A Second Embodiment

Figure 15:
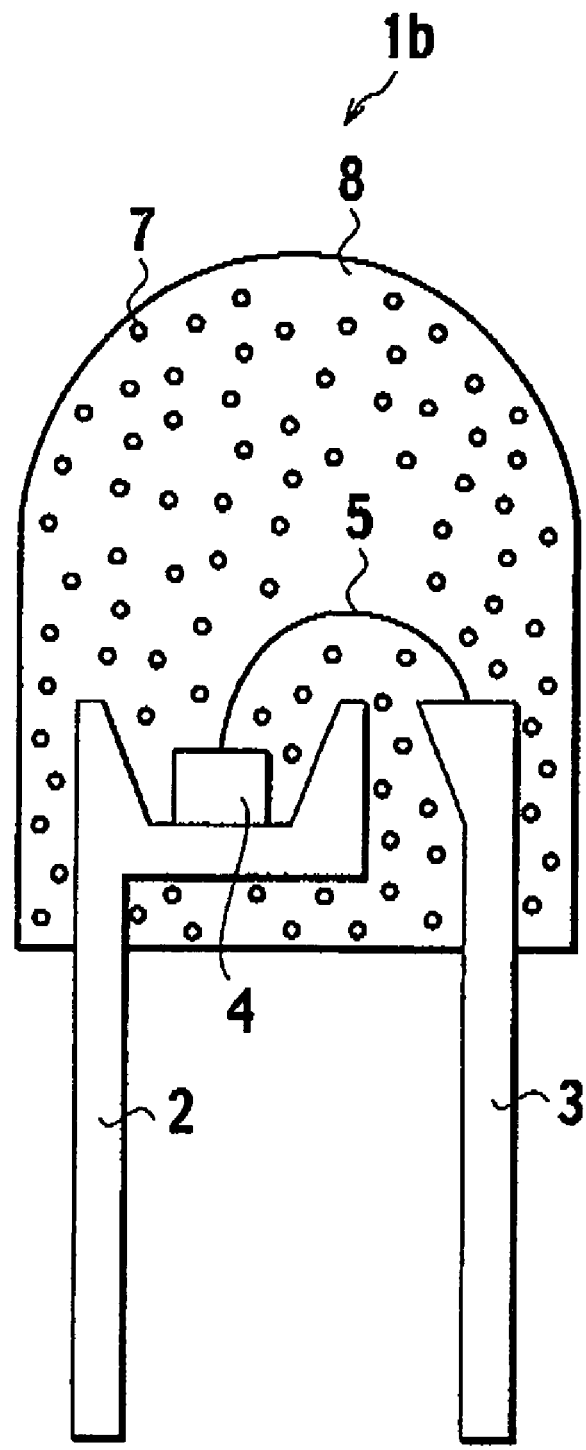
FIG. 15 is a cross-sectional view of a light emitting diode according to a second embodiment of the present invention.
Figure 16:
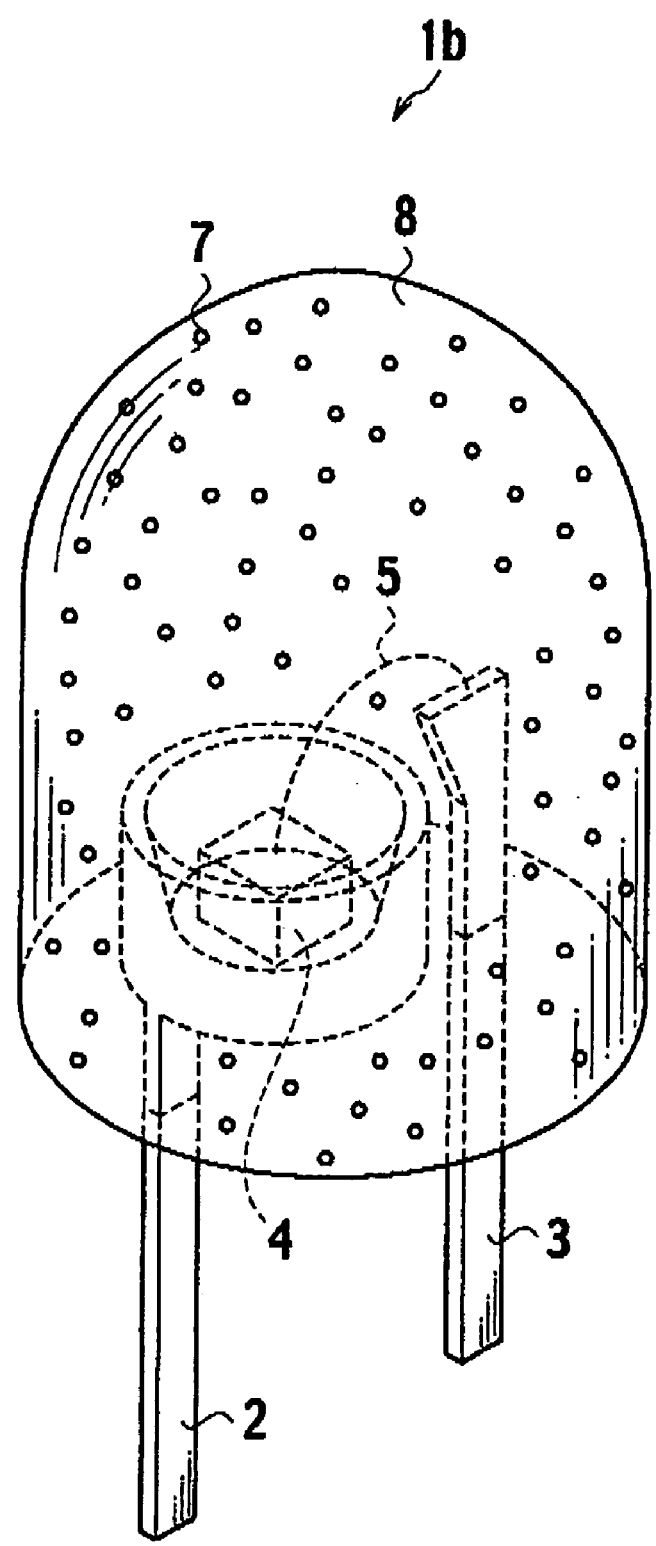
FIG. 16 is a perspective view of the light emitting diode shown in FIG. 15.

FIG. 15 is a cross-sectional view of a light emitting diode 1b according to a second embodiment of the present invention. FIG. 16 is a perspective view of the light emitting diode 1b.

Although, in the light emitting diode 1a shown in FIGS. 3 and 4, the phosphor 7 is dispersed in the vicinities of the light emitting diode chip 4, in other words, in the first resin 6, the light emitting device according to the present invention is not limited to this structure. The phosphor 7 can be dispersed in the second resin 8 as illustrated in this embodiment.

In fabricating the light emitting diode 1b, whereas the first resin 6 is not cured, a second resin 8 dispersed with the phosphor is deposited and cured.

As the phosphor 7 is used a phosphor of which an excitation spectrum has a flat region in a wavelength range including a principal wavelength of the light from the light emitting chip 4. As such a phosphor, a SiAlON phosphor as expressed in a general chemical formula of $Ca_x(Si, Al)_{12}(O,N)_{16}:Eu^{2+}{}_y$ is preferable. According to this type of SiAlON phosphor, when the composition x is in a range from 0 to 1.0 and the composition y is in a range from 0 to 0.25, a large flat region of 20 nanometers or more is realized in its excitation spectrum. Furthermore, when the compositions x and y are in a range from 0 to 0.5 and from 0 to 0.25, respectively, a wider flat region of 40 nanometers or more is realized in its excitation spectrum. Yet furthermore, when the compositions x and y are in a range from 0.75 to 1.0 and from 0.04 to 0.25, respectively, an extremely higher emission intensity is realized while assuring a flat breadth of 20 nanometers or more.

A Third Embodiment

Figure 17:
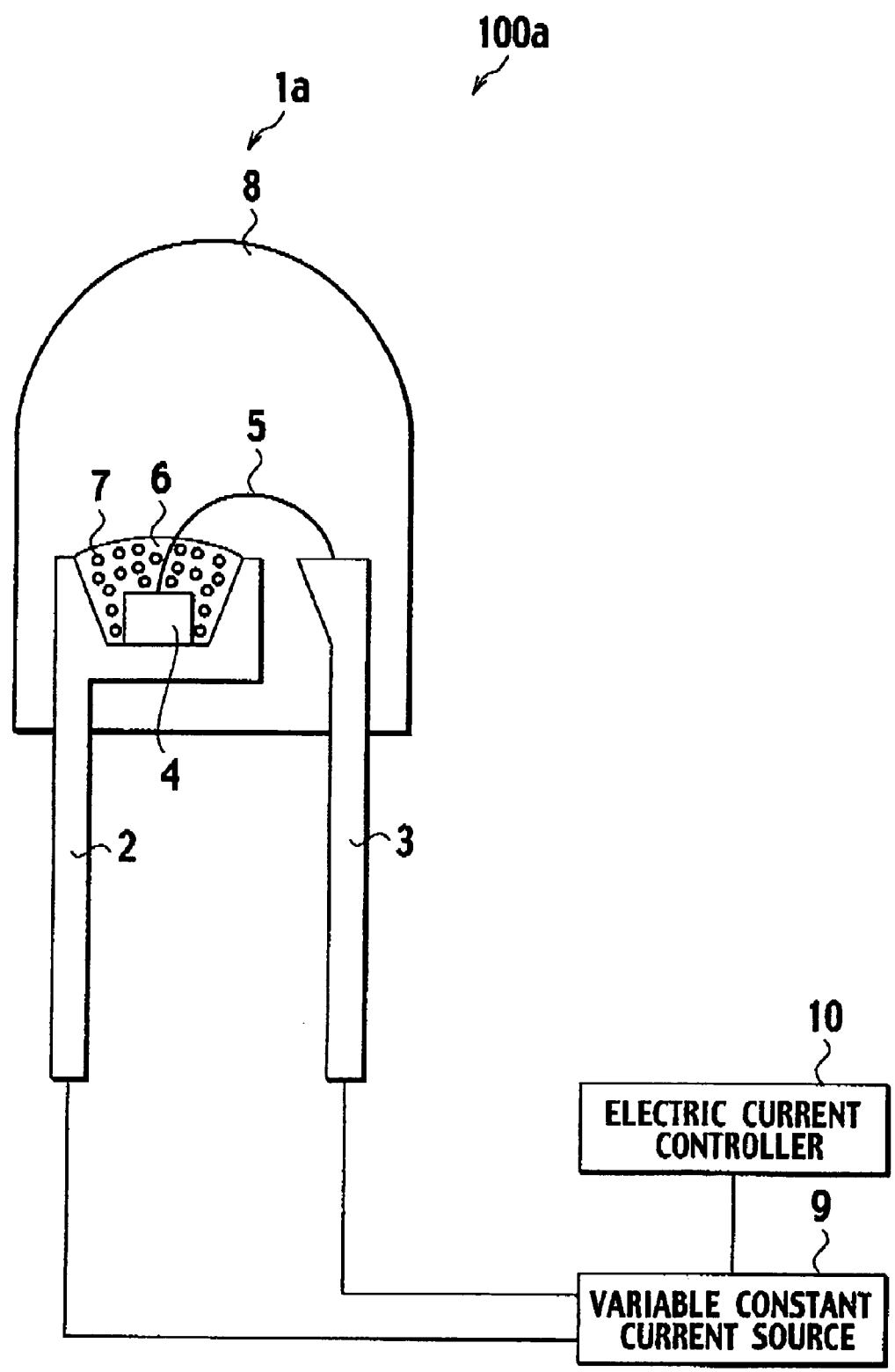
FIG. 17 is a block diagram of a lighting apparatus according to a third embodiment.

FIG. 17 illustrates a configuration of an lighting apparatus 100a according to a third embodiment of the present invention, along with a cross-section of a light emitting diode 1a thereof.

The lighting apparatus 100a is composed of the light emitting diode 1a, a variable constant-current source 9 and an electric current controller 10. The light emitting diode 1a comprises the same light emitting diode as described in the first embodiment and the explanation thereof is omitted.

The variable constant-current source 9 is connected to the light emitting diode 1a, thereby supplying an electric current thereto.

The electric current controller 10 is connected to the variable constant-current source 9 and thereby can set a current value of the electric current supplied to the diode 1a.

In addition, the electric current controller 10 is provided with a manually operable knob for determining the electric current value. The electric current controller 10 may include a control circuit for receiving data to regulate a quantity of light via a data communication means or the like.

Next, measurement results of chromaticity coordinates and a distance shift on the chromaticity diagram about the above lighting apparatus will be shown.

When the electric current to the light emitting diode 1a was changed from 1 mA to 20 mA by the electric current controller 10, the chromaticity coordinates (x, y) on the CIE XYZ color specification system shift from (0.382, 0.346) to (0.389, 0.349), which corresponds to a distance shift of as small as 0.007 on the diagram.

The above results show that there has been realized a lighting apparatus capable of suppressing a chromaticity change when regulating the intensity of the light therefrom.

A Fourth Embodiment

Next, referring to FIG. 18, a lighting apparatus 100b according to a fourth embodiment of the present invention will be described.

The lighting apparatus 100b, which is a modification of the above mentioned lighting apparatus 100a, has the light emitting diode 1b instead of the light emitting diode 1a. The light emitting diode 1b comprises the same light emitting diode described in the second embodiment and the explanation thereof is omitted.

Figure 18:
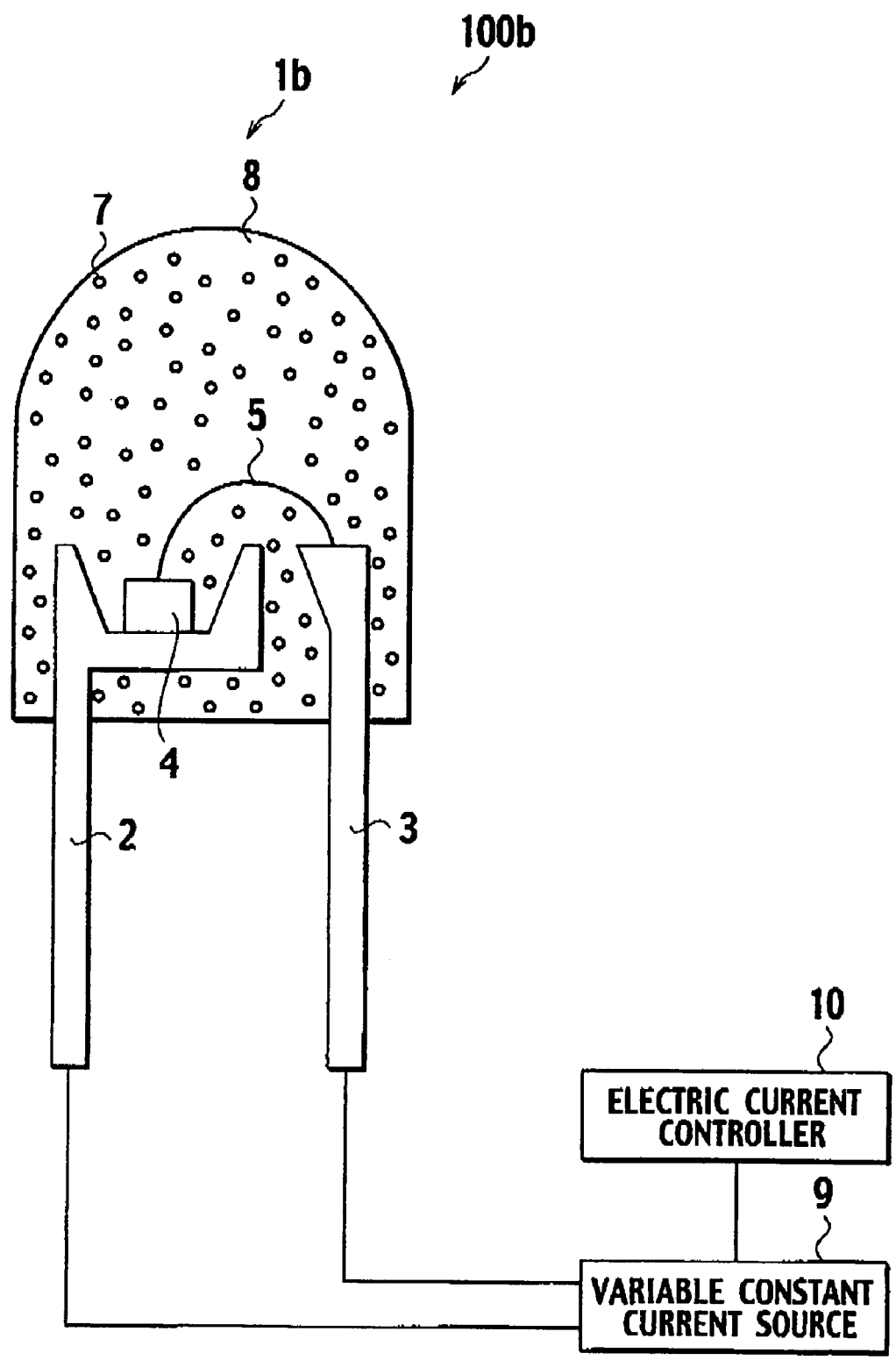
FIG. 18 is a block diagram of a lighting apparatus according to a fourth embodiment.

FIG. 18 illustrates a configuration of the lighting apparatus 100b, along with a cross-section of the light emitting diode 1b.

In addition, Cerium (Ce), Terbium (Tb), Praseodymium (Pr) or the like can be used without limiting to Eu, although the first and the second embodiments have exemplified Eu as a rare earth metal.

Additionally, the first and second embodiments have described the light emitting diode chip 4 having one electrode on an upper side (i.e., on the side to be connected with the bonding wire 5) and the other on a lower side (i.e., on the side to contact with the element-accommodating cup). However, a light emitting diode chip having two electrodes on the upper side and none on the lower side can be used.

In this case, as long as the light emitting diode chip is fixed on the lead wire, an electrically conductive paste is not necessarily required in the first process. Instead, two bonding wires are required in the second process.

In addition, the light emitting device according to the present invention is not necessarily limited to the first and the second embodiments but can be modified variously. The present invention is applicable to any light emitting diodes comprising a short-wavelength light emitting diode chip and a phosphor that can be excited by absorbing part or all of the light from the light emitting diode chip to emanate longer-wavelength light.

For example, the present invention is applicable to a blue light emitting diode employing an ultra-violet light emitting diode chip and a phosphor emanating visible light upon excitation by ultra-violet light, a green light emitting diode employing an ultra-violet light emitting diode chip and a phosphor emanating visible light upon excitation by ultra-violet light, a red light emitting diode employing an ultra-violet light emitting diode chip and a phosphor emanating visible light upon excitation by ultra-violet light, and a white light emitting diode employing an ultra-violet light emitting diode chip and a phosphor emanating visible light upon excitation by ultra-violet light.

In addition, the lighting apparatus according to the present invention is not necessarily limited to the third and fourth embodiments employing a white light emitting diode but can be modified variously. The present invention is applicable to any lighting apparatus employing a light emitting diode comprising a short-wavelength light emitting diode chip and a phosphor that can be excited by absorbing part or all of the light emitted from the light emitting diode chip to emanate longer-wavelength light.

For example, the present invention is applicable to a blue light lighting apparatus equipped with a blue light emitting diode employing an ultra-violet light emitting diode chip and a phosphor emanating visible light upon excitation by ultra-violet light; a green light lighting apparatus equipped with a green light emitting diode employing an ultra-violet light emitting diode chip and a phosphor emanating visible light upon excitation by ultra-violet light; a red light lighting apparatus equipped with a red light emitting diode employing an ultra-violet light emitting diode chip and a phosphor emanating visible light upon excitation by ultra-violet light; and a white light lighting apparatus equipped with a white light emitting diode employing an ultra-violet light emitting diode chip and a phosphor emanating visible light upon excitation by ultra-violet light.

Moreover, the present invention is applicable to a light emitting diode that needs 3 or more bonding wires. Also, the shape of lead wires is not limited to that illustrated here as long as the light emitting diode chip can be fixed.

Furthermore, without limiting to a light emitting diode chip, any type of light emitting element including a laser diode can be utilized in the present invention.

What is claimed is:

1. A light emitting device comprising:
   at least two lead wires,
   a light emitting element that is disposed on an end portion of at least one of said lead wires and connected electrically with the end portion and the other of said lead wires, and
   a phosphor that absorbs at least part of the light emitted from said light emitting element and emits fluorescence having a different wavelength from the wavelength of the light emitted from said light emitting element, the phosphor having an excitation spectrum including a peak fluorescent intensity at a peak wavelength from 457 nm to 467 nm and a flat region ranging over 20 nm or more around the peak wavelength, the flat region providing reduction in fluorescent intensities by 3 percent or less as compared to the peak fluorescent intensity,
   wherein said phosphor is a rare-earth-metal activated SiAlON ceramics phosphor,
   wherein said SiAlON ceramics phosphor is a divalent-europium activated Ca-alpha-SiAlON ceramics phosphor, and
   wherein said SiAlON ceramics phosphor is expressed in a general formula as:

$$Ca_x(Si, Al)_{12}(O,N)_{16}:Eu^{2+}{}_y$$

wherein the Ca composition x is in a range of from 0 to 1.0 and the Eu composition y is in a range of from 0 to 0.25.

2. A light emitting device according to claim 1,
   wherein said light emitting element is a blue light emitting element, and
   wherein said phosphor absorbs light having a wavelength of from 440 nm to 470 nm and appearing purplish blue or blue, and thereby emits fluorescence having a wavelength of from 550 nm to 600 nm and appearing yellow green, greenish yellow, yellow, yellowish orange, or orange.

3. A light emitting device according to claim 1,
   wherein an excitation wavelength area in which a reduction in fluorescence intensity is three percent or less in said flat region has a breadth of about 40 nm or more, and
   wherein said SiAlON ceramics phosphor has the Ca composition x of from 0 to 0.5.

4. A light emitting device according to claim 1, wherein said light emitting element is a light emitting diode element.

5. A lighting apparatus comprising:
   at least two lead wires,
   a light emitting element that is disposed on an end portion of at least one of said lead wires and connected electrically with the end portion and the other of said lead wires,
   a phosphor that absorbs at least part of the light emitted from said light emitting element and emits fluorescence having a different wavelength from the wavelength of the light emitted from said light emitting element, the phosphor having an excitation spectrum including a peak fluorescent intensity at a peak wavelength from 457 nm to 467 nm and a flat region including a principal wavelength of the light from said light emitting element and ranging over 20 nm or more around the peak wavelength, the flat region providing reduction in fluorescent intensities by 3 percent or less as compared to the peak fluorescent intensity,
   a variable constant current electric power supply configured to supply electric current to said lead wires, and
   an electric current controller configured to set an electric current value in said variable constant current electric power supply,
   wherein said phosphor is a rare-earth-metal activated SiAlON ceramics phosphor,
   wherein said SiAlON ceramics phosphor is a divalent-europium activated Ca-alpha-SiAlON ceramics phosphor, and
   wherein said SiAlON ceramics phosphor is expressed in a general formula as:

$$Ca_x(Si, Al)_{12}(O,N)_{16}:Eu^{2+}{}_y$$

wherein the Ca composition x is in a range of from 0 to 1.0 and the Eu composition y is in a range of from 0 to 0.25.

6. A lighting apparatus according to claim 5,
wherein said light emitting element is a blue light emitting element, and
wherein said phosphor absorbs light having a wavelength of from 440 nm to 470 nm and appearing purplish blue or blue, and thereby emits fluorescence having a wavelength of from 550 nm to 600 nm and appearing yellow green, greenish yellow, yellow, yellowish orange, or orange.

7. A lighting apparatus according to claim 5,
wherein an excitation wavelength area in which a reduction in fluorescence intensity is three percent or less in said flat region has a breadth of about 40 nm or more, and
wherein said SiAlON ceramics phosphor has the Ca composition x of from 0 to 0.5.

8. A lighting apparatus according to claim 5, wherein said light emitting element is a light emitting diode element.

\* \* \* \* \*